US006594300B2

(12) United States Patent
Wipiejewski

(10) Patent No.: US 6,594,300 B2
(45) Date of Patent: Jul. 15, 2003

(54) VERTICAL-RESONATOR-LASER-DIODE WITH A LIGHT-ABSORBING LAYER AND METHOD OF MANUFACTURING THE SAME

(75) Inventor: Torsten Wipiejewski, Santa Barbara, CA (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/940,005

(22) Filed: Aug. 27, 2001

(65) Prior Publication Data
US 2002/0088980 A1 Jul. 11, 2002

Related U.S. Application Data

(63) Continuation of application No. PCT/DE00/00543, filed on Feb. 25, 2000.

(30) Foreign Application Priority Data

Feb. 26, 1999 (DE) .......................................... 199 08 426

(51) Int. Cl.[7] .............................................. H01S 5/183
(52) U.S. Cl. ............................. 372/96; 372/46; 372/49
(58) Field of Search ........................... 372/96, 49, 45, 372/46

(56) References Cited

U.S. PATENT DOCUMENTS

| 5,637,511 A | 6/1997 | Kurihara ...................... 438/39 |
| 5,745,515 A | 4/1998 | Marta et al. .................. 372/45 |
| 5,838,715 A | 11/1998 | Corzine et al. ............... 372/96 |
| 6,160,834 A * | 12/2000 | Scott ........................... 372/96 |

FOREIGN PATENT DOCUMENTS

| EP | 0 892 473 A1 | 1/1999 |
| JP | 01310585 | 12/1989 |

OTHER PUBLICATIONS

Brivio: "Feedback effects in optical communication systems: characteristic curve for single–mode InGaAsP lasers" 2219 Applied Optics 31 (1992) Aug. 20, No. 24, New York, US, pp. 5044–5050.

Michalzik: "Vertical cavity laser diodes—promising devices for optical interconnect applications", Laser und Optoelektronik 30 (3)/1998, pp. 78–85.

* cited by examiner

Primary Examiner—James Davie
(74) Attorney, Agent, or Firm—Laurence A. Greenberg; Werner H. Stemer; Ralph E. Locher

(57) ABSTRACT

A vertical-resonator-laser-diode and a method of manufacturing the same are disclosed. An active layer sequence for the production of laser-radiation is assembled between a first Bragg-reflector-layer-sequence and a second Bragg-reflector-layer-sequence. Each Bragg-reflector-layer-sequence has a plurality of mirror-pairs; the two Bragg-reflector-layer-sequences form a laser-resonator. The two Bragg-reflector-layer-sequences and the active layer-sequence are assembled between a first and a second electrical contact-layer. At least one of the two Bragg-reflector-layer-sequences is semitransparent for the laser-radiation. At least one light-absorbing layer is assembled with a given light-absorption either between the semitransparent Bragg-reflector-layer-sequence and the first electrical contact-layer, or on the light-outlet-side of the first electrical contact-layer.

5 Claims, 1 Drawing Sheet

VERTICAL-RESONATOR-LASER-DIODE WITH A LIGHT-ABSORBING LAYER AND METHOD OF MANUFACTURING THE SAME

CROSS-REFERENCE TO RELATED APPLICATION

This application is a continuation of copending International Application No. PCT/DE00/00543, filed Feb. 25, 2000, which designated the United States.

BACKGROUND OF THE INVENTION

FIELD OF THE INVENTION

The invention relates to a vertical-resonator-laser-diode and to a method of manufacturing the same. A vertical-resonator-laser-diode of the generic type is described in U.S. Pat. No. 5,637,511. There is specified a vertical-resonator-laser-diode with areas of high resistance for charge carrier reduction, in which the light decoupling results through substratum.

The use of vertical-resonator-laser-diodes (VCSEL) in optical send modules, such as, PAROLI, frequently requires a relatively low differential quantum efficiency (DQE) of the component within restricted specification limits. During the process, high demands are made on the ability of reproduction of the manufacturing processes. Thus, to increase the output, a setting of the DQE according to the epitaxial growth during the component processing would be desirable.

A further problem with the VCSELs arises because the reflections of the VCSEL-output radiation on close surfaces, for example, the optical fiber-input end face, could lead to great signal noise of the component. This would limit the output capacity of optical data transmission systems.

Heretofore, the DQE of VCSELs was determined through the characteristics of semiconductor layers that are deposited on the wafer during the epitaxial growth. For example, to reach a relatively low DQE, a great number of layer pairs in the output mirror of the VCSEL were used. However, the internal optical intensity increases in comparison to the external radiation strength, which can have a negative effect on the life span of the components.

The optical feedback sensibility of VCSELs has, heretofore, only been reduced through external optical elements, for example, partially mirror coated lenses. Optical insulators, for example, the ones that are used in the optical communication technology, have to be eliminated for use in data links over short distances, due to financial reasons.

In U.S. Pat. No. 5,838,715, a VCSEL-laser diode is described. There, the creation of wave carrier modes of a higher order is avoided by connecting a loss determining element, at the light-outlet-side of the diode, to the optical cavity, with which the loss of the optical power through absorption with increasing lateral distance of the optical axle increases. The loss-determining element is developed in the simplest case as a depression, which shows a curve-shaped course with a minimum at the optical axle.

European Patent Application No. EP 0 892473 A1, corresponding to U.S. Pat. No. 6,163,556, describes a semiconductor laser, which shows a transparent lens cap with a partially reflecting coating for the reduction of the emitted radiation energy at the light-outlet-side.

In U.S. Pat. No. 5,745,515 a VCSEL-semiconductor laser is described. There is specified a quarter wave length layer in one of the two reflecting mirror sequences, which works as an absorption layer to the semiconductor laser, thereby limiting the emitted optical power of the semiconductor laser effectively.

SUMMARY OF THE INVENTION

It is accordingly an object of the present invention to provide a vertical-resonator-laser-diode with a light-absorbing layer and a method of manufacturing the same that overcome the hereinafore-mentioned disadvantages of the heretofore-known devices of this general type and that can set differential quantum efficiency specifically, and concurrently can reduce the optical feedback sensitivity.

With the foregoing and other objects in view, there is provided, in accordance with the present invention, a vertical-resonator-laser-diode, including a first and a second electrical contact layers. A first Bragg-reflector-layer-sequence and a second Bragg-reflector-layer-sequence, each having a plurality of mirror-pairs, are disposed between the first and second electrical contact layers. An active layer-sequence is assembled between the first and second electrical contact layers and between the first Bragg-reflector-layer-sequence for creating a laser-radiation. The first Bragg-reflector-layer-sequence and the second Bragg-reflector-layer-sequence form a laser-resonator. At least one of the Bragg-reflector-layer-sequences is semi-transparent for the laser-radiation, thereby forming a semi-transparent Bragg-reflector-layer-sequence. At least one light-absorbing layer is assembled with a given light-absorption on the semi-transparent Bragg-reflector-layer-sequence on the light-outlet-side.

In accordance with another feature of the present invention, the light-absorbing layer is assembled between the semi-transparent Bragg-reflector-layer-sequence and the first electrical contact layer.

In accordance with another feature of the present invention, the light-absorbing layer is applied on a light-outlet-side of the first electrical contact layer.

In accordance with another feature of the present invention, the light-absorbing layer is assembled in an area of a light-outlet-opening. The light-outlet-opening is formed in the first electrical contact-layer and the light-absorbing layer has a given thickness.

With the objects of the invention in view, there is also provided a method of manufacturing a vertical-resonator-laser-diode, which includes the steps of applying a first Bragg-reflector-layer-sequence, an active layer-sequence, a second Bragg-reflector-layer-sequence and a light-absorbing layer onto a first side of a semiconductor-substratum, wherein the semiconductor-substratum has a given thickness. The method further includes the steps of applying a first electrical contact-layer to the light-absorbing layer, wherein the first electrical contact-layer has a light-outlet-opening. It further includes the steps of applying a second electrical contact-layer to a second side of the substratum, measuring an optical power determining a differential quantum efficiency, and etching away the light-absorbing layer in an area of the light-outlet-opening until a desired differential quantum efficiency is reached.

With the objects of the invention in view, there is also provided, a method of manufacturing a vertical-resonator-laser-diode, which includes the step of applying a first Bragg-reflector-layer-sequence, an active layer-sequence, and a second Bragg-reflector-layer-sequence onto a first side of a semiconductor-substratum. The method further includes the step of applying a first electrical contact-layer to the second Bragg-reflector-layer-sequence, wherein the first electrical contact-layer has a light-outlet-opening. The method further includes the steps of applying a second electrical contact-layer to a second side of the substratum and applying a light-absorbing layer in an area of the light-outlet-opening. The light-absorbing layer has a given thickness and measuring an optical power. The method further includes the steps of determining a differential quantum efficiency and etching away the light-absorbing layer in the area of the light-outlet-opening until a desired differential quantum efficiency is reached.

With the objects of the invention in view, there is also provided a method of manufacturing a vertical-resonator-laser-diode, which includes the steps of applying a first Bragg-reflector-layer-sequence, an active layer-sequence and a second Bragg-reflector-layer-sequence onto a first side of a semiconductor-substratum and applying a first electrical contact-layer to the second Bragg-reflector-layer-sequence. The first electrical contact-layer has a light-outlet-opening. The method further includes the steps of applying a second electrical contact-layer to a second side of the substratum and measuring an optical power. The method further includes the steps of determining a differential quantum efficiency, and gradually applying a light-absorbing layer in an area of the light-outlet-opening until a desired differential quantum efficiency is reached.

Accordingly, the present invention is directed to providing a vertical-resonator-laser-diode, with which the differential quantum efficiency can be set specifically, and with which, concurrently, the optical feedback sensitivity can be reduced.

In the present invention, the external DQE, which is visible to the outside, is reduced by at least one absorbing layer, which sits in the environment of the surface of the vertical-resonator-laser-diode (VCSEL). The absorbing layer reduces the number of the photons that reach the outside through fundamental absorption.

The production of the light-absorbing layer can, in principle, be bound into the manufacturing process of the VCSEL in two different ways.

In the first embodiment, the light-absorbing layer is to an extent monolithically integrated into the VCSEL. Accordingly, it is directly deposited onto the VCSEL, in connection with the application of the Bragg-reflector-layer sequence at the light-outlet-side, preferably with one-and-the-same growth procedure with a certain thickness. Following that a light-outlet-side electrical contact-layer is applied to the light-absorbing layer and it is supplied with a light outlet opening. Then the optical power of the VCSEL is measured and the differential quantum efficiency is determined. Then, the light-absorbing layer is alternately etched away in the area of the light-outlet-opening and the optical power is measured. This step of the procedure is repeated until the desired differential quantum efficiency is reached.

In the second embodiment, the VCSEL is being constructed and, then, the light-absorbing layer is applied onto the light-outlet-side electrical contact-layer. The setting for the appropriate thickness may be done, in turn, in two different ways. The light-absorbing layer may on the one hand, like in the first embodiment, be applied with a determined sufficient thickness and may be etched away alternating with the optical power measurements. On the other hand, the light-absorbing layer may be applied gradually with low layer-thickness-increments, while alternating with the optical power measurements.

For the wavelength of 850 nm, which is important nowadays in the optical data-transmission, in the first model, an absorbing layer, for example, a GaAs-layer, which is up to several μm may be used. In the second embodiment, for example, amorphous silicon may be applied through an appropriate deposition procedure.

At the same time, the absorbing layer also reduces the external steepness of the component, besides the differential quantum efficiency, without considerably increasing the internal photon-thickness. The absorbing layer additionally lowers external reflections that fall back into the optical resonator of the VCSELs, so that an improved stability of the component is provided with regard to external repercussions. Other features which are considered as characteristic for the invention are set forth in the appended claims.

Although the invention is illustrated and described herein as embodied in a vertical-resonator-laser-diode with a light-absorbing layer, and a method of manufacturing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
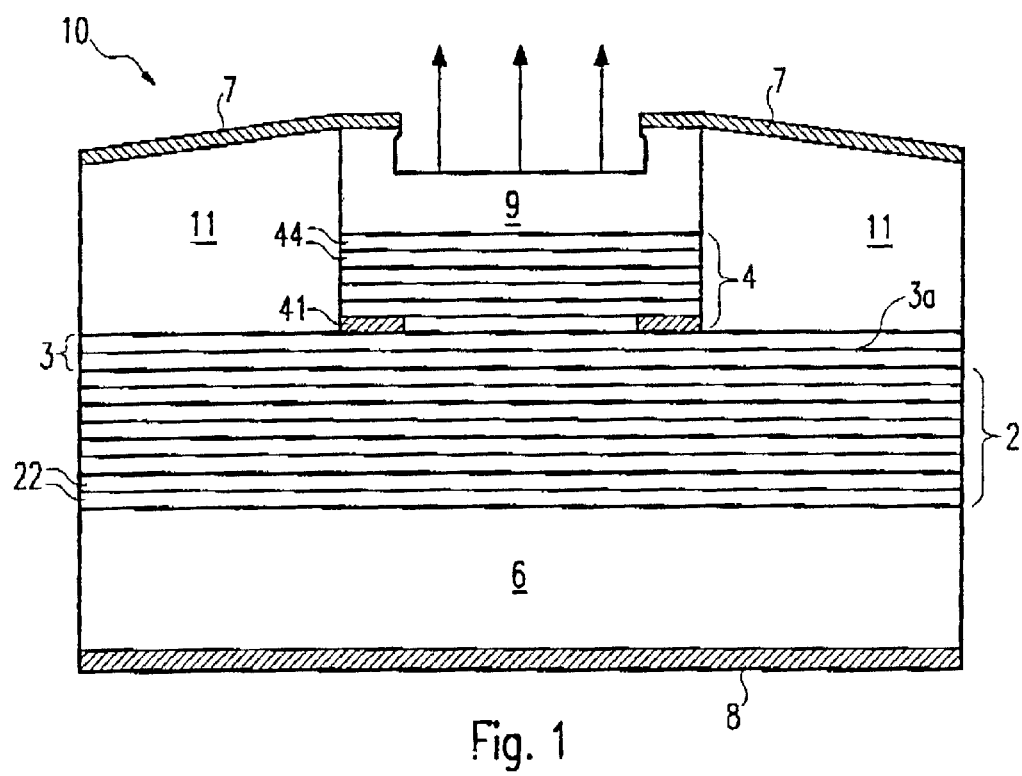
FIG. 1 is a diagrammatic, sectional view, which illustrates an epitaxial layer structure of a vertical-resonator-laser-diode in accordance with one embodiment of the present invention.

In all the figures of the drawing, sub-features and integral parts that correspond to one another bear the same reference symbol in each case.

Referring now to the figures of the drawing in detail and first, particularly, to FIG. 1 thereof, there is shown an epitaxial layer structure of a vertical-resonator-laser-diode 10, in accordance with one embodiment of the present invention, in which a light-absorbing layer 9 is monolithically integrated into the laser-diode.

A first, lower Bragg-reflector-layer-sequence 2, which is disposed on a first side of a GaAs-substratum 6, is formed of individual, identical mirror-pairs 22. The mirror-pairs are formed of two AlGaAs-layers having different energy gaps. In the same manner, a second, upper Bragg-reflector-layer-sequence 4 is formed of corresponding mirror-pairs 44. An active layer-sequence 3, which has an active zone 3a, is embedded between the lower Bragg-reflector-layer-sequence 2 and the upper Bragg-reflector-layer-sequence 4. In the portrayed example, the emission wavelength of the laser-diode is about 850 nm. A first metallization-layer 7, which is disposed on the upper surface of the laser-diode 10, is used for the electrical connection of the p-doped side of the laser-diode 10. The first metallization-layer 7 has a central opening for the passage of laser radiation. The n-doped side of the diode is usually electrically connected via a second metallization-layer 8, which is connected to a second side of the substratum 6.

The upper Bragg-reflector-layer-sequence 4 contains a mirror-pair 44, which further contains a current-aperture 41. The current-aperture 41 ensures a lateral current limiting, and thus defines the actual, active, light-emitting area in the active zone 3a. The current-flow is limited to the opening area of the current-aperture 41. Thus, the light-emitting area lies directly beneath the opening area in the active zone 3a.

The current-aperture 41 can be made, in the conventional manner, by partial oxidation of the AlGaAs-layers of the pertinent mirror-pair, or through implantation of ions or protons.

The upper Bragg-reflector-layer-sequence 4 of the laser-diode 10 is structured, in the form of a mesa-structure, above the active layer sequence 3. The mesa-shaped upper Bragg-reflector-layer-sequence 4 is enclosed, sideways, by a passivation-layer 11.

A light-absorbing layer 9 is applied above the upper Bragg-reflector-layer-sequence 4. Through the use of the light-absorbing layer 9, a specific attenuation of the emitted light radiation can be set through light absorption. Thus, the differential quantum efficiency (DQE) of the laser-diode can be set specifically, using the layer 9. With an emission-wavelength of 850 nm of the material for the light-absorbing layer 9, GaAs with a layer-thickness in the magnitude of several $\mu$m may be used. The GaAs-layer is preferably deposited together with other semiconductor-layers of the laser-diode. An MBE (molecular beam epitaxy) or MOCVD (metal-organic gas-phase epitaxy) serves as a growth-procedure. Although the desired layer-thickness can be set relatively exactly, through the setting of the growth-parameter, the differential quantum efficiency is the product of several factors, for example, the material absorption, which in turn depends on the doping. Therefore, the setting of the DQE is performed as follows: the light-absorbing layer 9 is first deposited with an adequate layer-thickness, and afterwards it is partially etched away.

Accordingly, the VCSEL is first constructed and the emitted optical power is measured, from which the DQE is determined. Then, the light-absorbing layer 9 is partially etched away in the area of the light-outlet opening of the first electrical contact layer. The deposited metallization-layer 7 may function as an etching-mask. Accordingly, a depression etched into the GaAs-layer 9, and the slight undercutting in the guard zone of the light-outlet opening is shown in FIG. 1.

The manufacturing of the mesa-structure of the laser-diode and the creation of the oxide-aperture 41 ensues after the epitaxy of the light-absorbing layer 9. Then, the structure is planarized with the passivation-layer 11, and the first contact-layer 7 is applied. Next, the setting of the layer-thickness for the light-absorbing layer 9 is performed.

Figure 2:
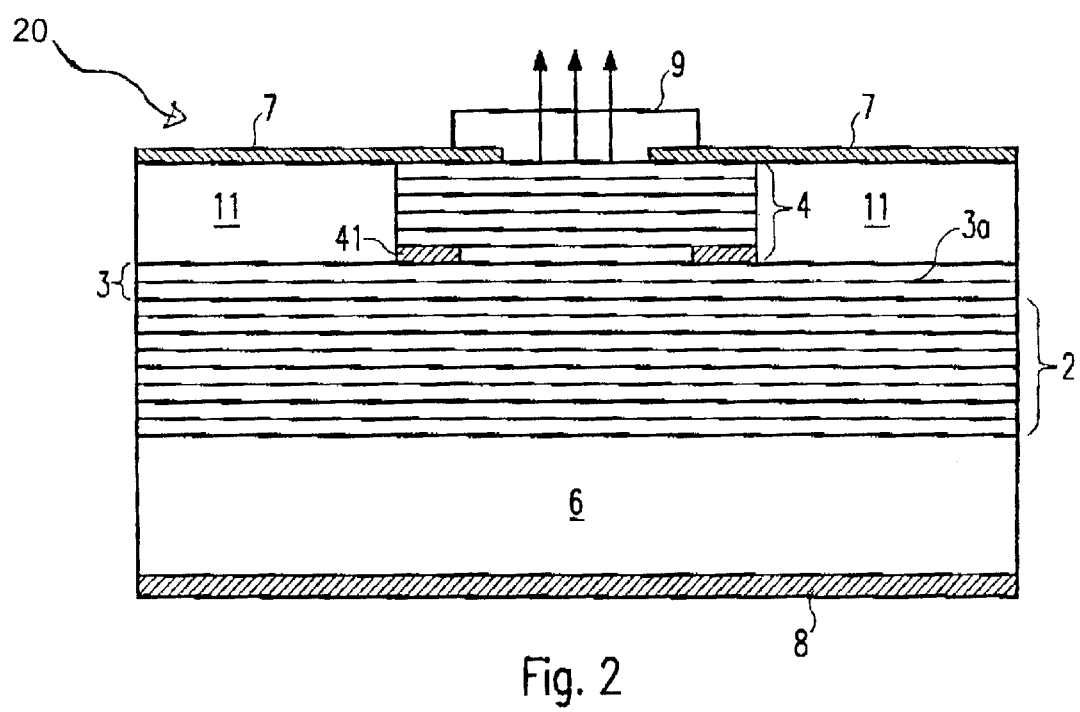
FIG. 2 is a sectional view, which illustrates an epitaxial layer structure of a vertical-resonator-laser-diode in accordance with a further embodiment of the present invention.

A further embodiment of the vertical-resonator-laser-diode 20, according to the present invention, is shown in FIG. 2.

In accordance with the further embodiment, the VCSEL is first constructed, and the first electrical contact layer 7 is applied onto the light-outlet-side Bragg-reflector-layer-sequence 4. If so desired, first the optical power can be measured and the DQE of the VCSEL can be determined. Afterwards, the application of the light-absorbing layer 9 ensues. The light-absorbing layer 9 can be formed of amorphous silicon. The light-absorbing layer 9 is first applied with an appropriate deposition procedure, such as a vapor deposition onto the light-outlet-side-opening. Preferably, the layer 9 is applied through an appropriate masking or through lift-off-technology in such a way that it covers the light-outlet-side-opening, and it slightly overlaps the first contacting layer 7 in the guard zone.

The appropriate layer thickness of the light-absorbing layer 9 can be set through alternatively applying the layer 9 and measuring the optical power, until the desired DQE is reached. However, it is also possible to first apply a layer of a sufficient thickness, as described in the first embodiment, and, then to set the appropriate layer thickness through the alternating etching and measuring of the optical power.

I claim:

1. A vertical-resonator-laser-diode, comprising:

first and second electrical contact layers;

a first Bragg-reflector-layer-sequence and a second Bragg-reflector-layer-sequence disposed between said first and second electrical contact layers, each having a plurality of mirror-pairs;

an active layer-sequence being assembled between said first and second electrical contact layers and between said first Bragg-reflector-layer-sequence and said second Bragg-reflector-layer-sequence for creating a laser-radiation;

said first Bragg-reflector-layer-sequence and second Bragg-reflector-layer-sequence forming a laser-resonator;

at least one of said Bragg-reflector-layer-sequences being semi-transparent for said laser-radiation, thereby forming a semi-transparent Bragg-reflector-layer-sequence; and at least one light-absorbing layer being assembled with a given light-absorption on said semi-transparent Bragg-reflector-layer-sequence on the light-outlet-side.

2. The vertical-resonator-laser-diode according to claim 1, wherein said light-absorbing layer is assembled between said semi-transparent Bragg-reflector-layer-sequence and said first electrical contact layer.

3. The vertical-resonator-laser-diode according to claim 1, wherein said light-absorbing layer is applied on a light-outlet-side of said first electrical contact layer.

4. The vertical-resonator-laser-diode according to claim 2, wherein said light-absorbing layer is assembled in an area of a light-outlet-opening, said light-outlet-opening being formed in said first electrical contact-layer, and said light-absorbing layer having a given thickness.

5. The vertical-resonator-laser-diode according to claim 3, wherein said light-absorbing layer is assembled in an area of a light-outlet-opening, said light-outlet-opening being formed in said first electrical contact-layer, and said light-absorbing layer having a given thickness.

* * * * *